United States Patent [19]
Seidler

[11] Patent Number: 5,344,343
[45] Date of Patent: Sep. 6, 1994

[54] SOLDER-BEARING LEAD

[75] Inventor: Jack Seidler, Flushing, N.Y.

[73] Assignee: North American Specialties Corporation, Flushing, N.Y.

[21] Appl. No.: 927,415

[22] PCT Filed: Apr. 11, 1991

[86] PCT No.: PCT/US91/02489
§ 371 Date: Sep. 21, 1992
§ 102(e) Date: Sep. 21, 1992

[87] PCT Pub. No.: WO91/16736
PCT Pub. Date: Oct. 31, 1991

Related U.S. Application Data

[63] Continuation-in-part of Ser. No. 510,004, Apr. 13, 1990, Pat. No. 5,030,144.

[51] Int. Cl.⁵ .......................... H01R 4/02; H01R 9/09
[52] U.S. Cl. ........................ 439/876; 29/846; 439/83
[58] Field of Search ............... 439/83, 876; 29/843, 29/874, 876

[56]  References Cited
U.S. PATENT DOCUMENTS

| | | |
|---|---|---|
| 3,915,546 | 10/1975 | Cobaugh et al. ............... 439/876 |
| 4,120,558 | 10/1978 | Seidler . |
| 4,183,611 | 1/1980 | Casciotti et al. . |
| 4,597,628 | 7/1986 | Seidler . |
| 4,618,209 | 10/1986 | Sonobe . |
| 4,728,305 | 3/1988 | Seidler . |
| 4,883,435 | 11/1989 | Seidler . |
| 4,900,279 | 2/1990 | Dennis . |
| 5,030,144 | 7/1991 | Seidler ........................... 439/876 |

FOREIGN PATENT DOCUMENTS 1082645  2/1960  Fed. Rep. of Germany .

OTHER PUBLICATIONS

"Injectable Solderable Terminal Pins", H. P. Byrnes, IBM Tech. Disc. Bull., vol. 9, No. 4, Sep. 1966, p. 366 (439–83).

Primary Examiner—Eugene F. Desmond
Attorney, Agent, or Firm—Darby & Darby

[57]  ABSTRACT

A solder-bearing lead adapted to be soldered to a conductive surface comprising an elongated body portion having a solder-bearing portion, a terminal portion, and a middle portion disposed between said solder-bearing portion and said terminal portion. The solder-bearing portion carries a solder mass either on a pair of projections extending from one edge of said body portion and forming a gap therebetween dimensioned to receive a solder mass, or on the opposed faces of said solderbearing portion. A region of the middle portion is twisted so that the solder-bearing portion lies in a plane substantially perpendicular to the plane of the terminal portion. The solder-bearing lead can be used as an edge clip for mounting a substrate such as a printed circuit board, or as a surfacemounted lead for a substrate.

49 Claims, 6 Drawing Sheets

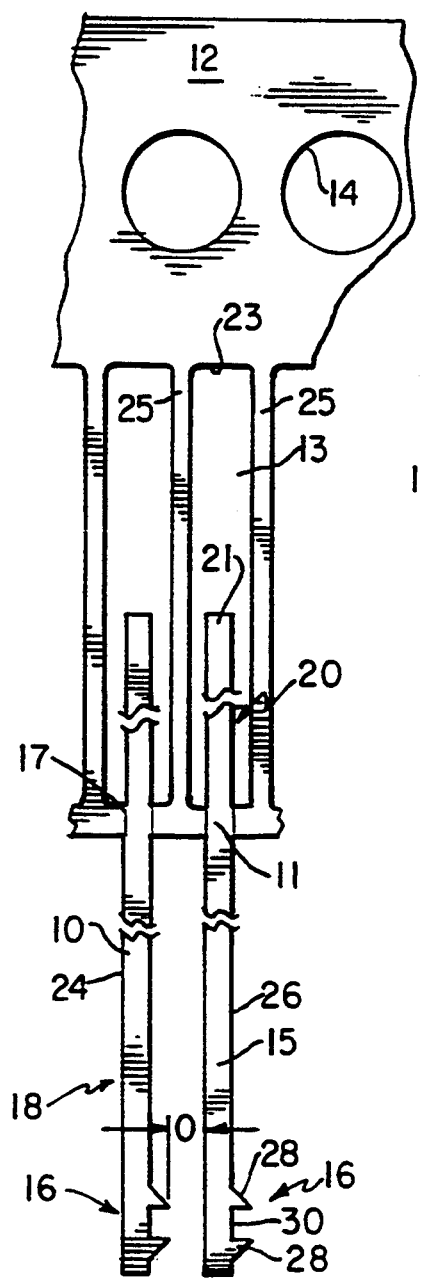
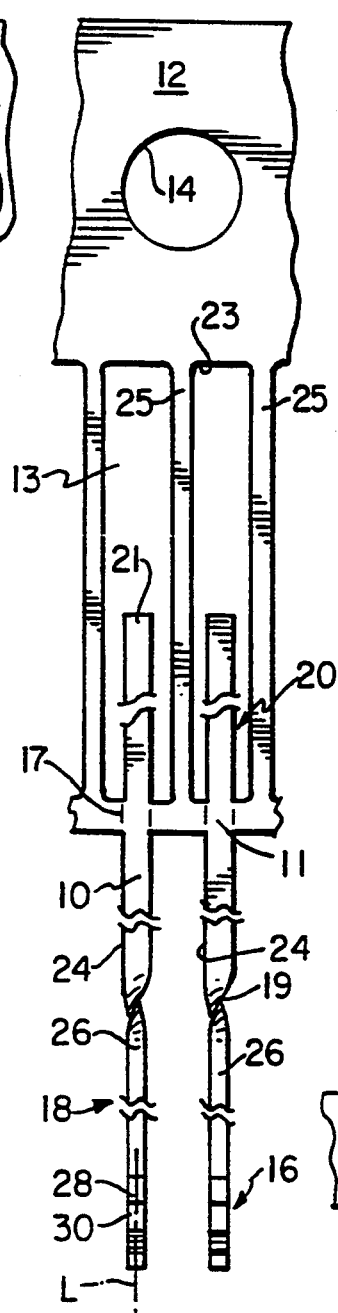
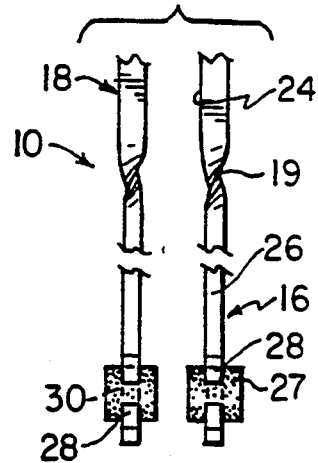
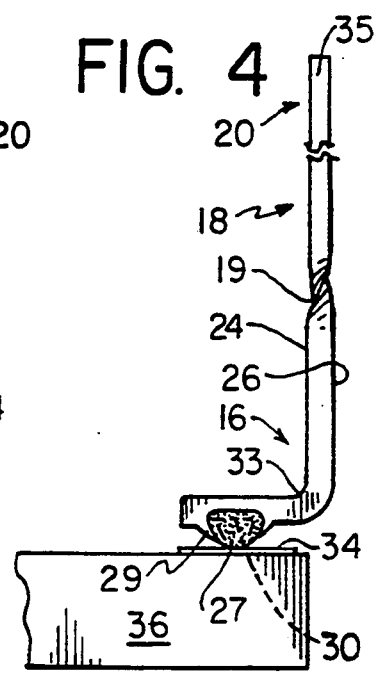
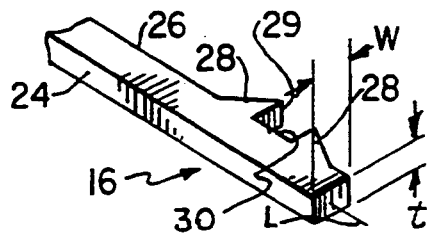
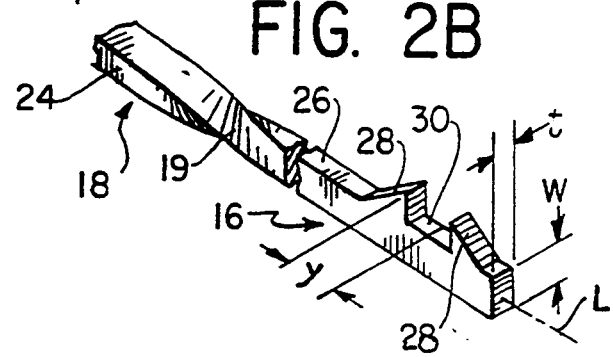

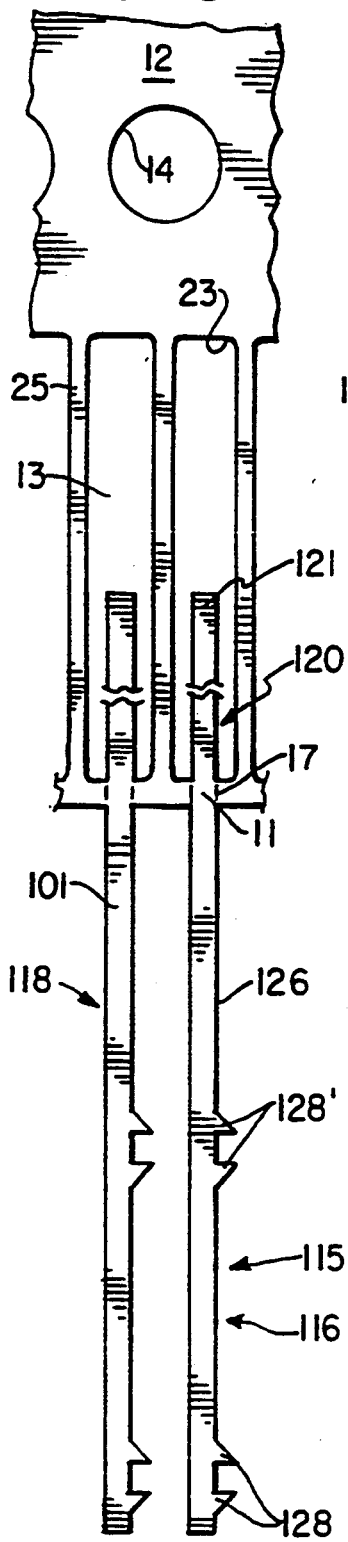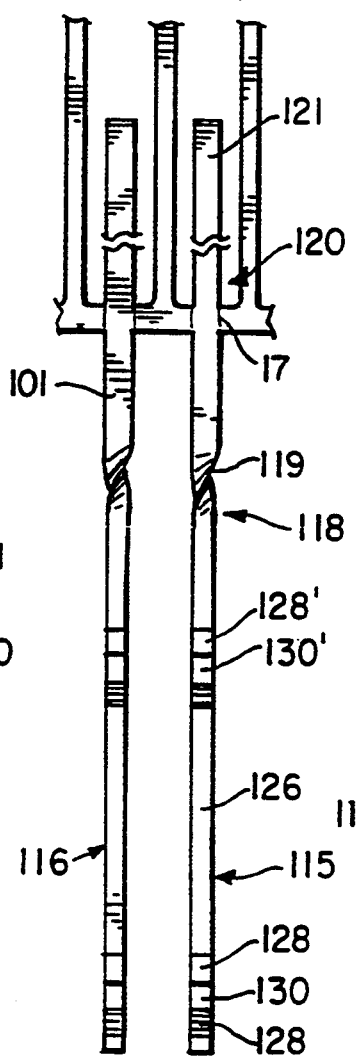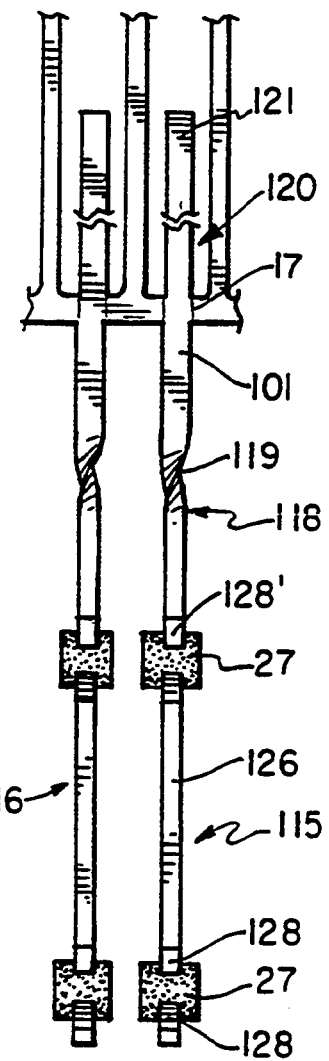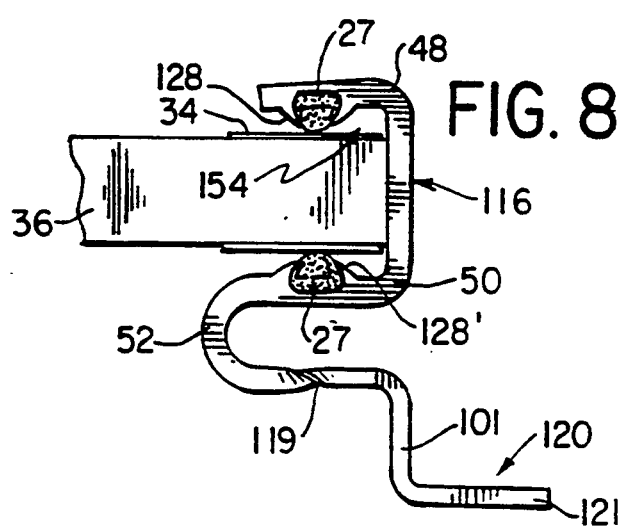

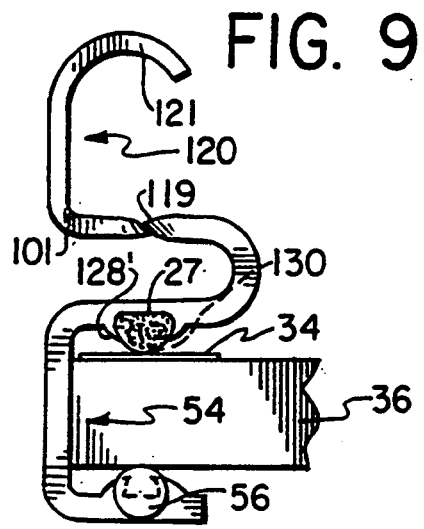
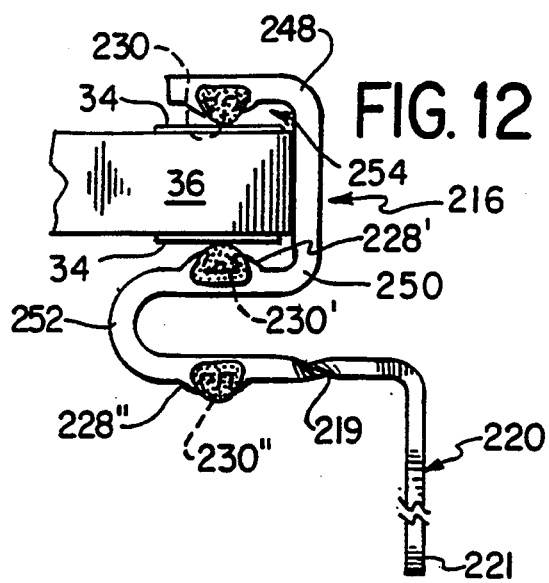
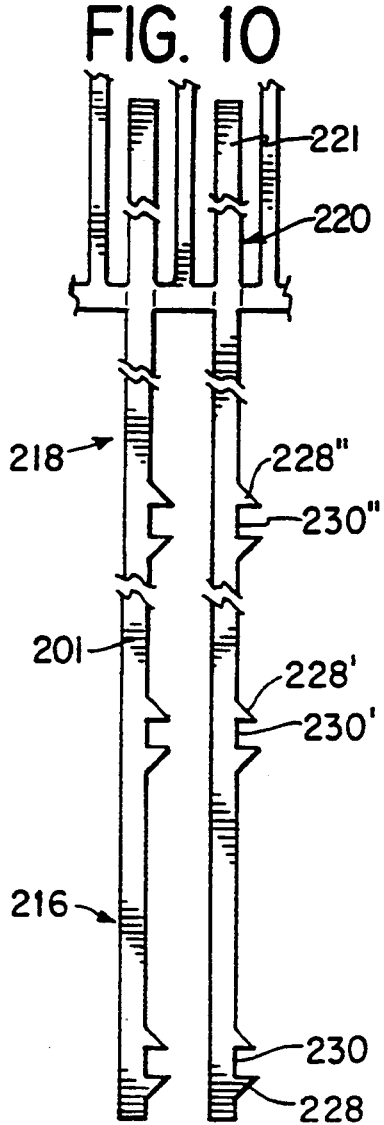
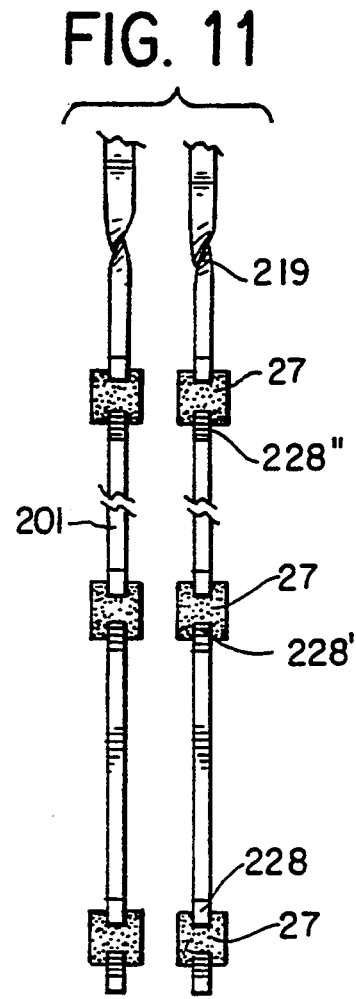

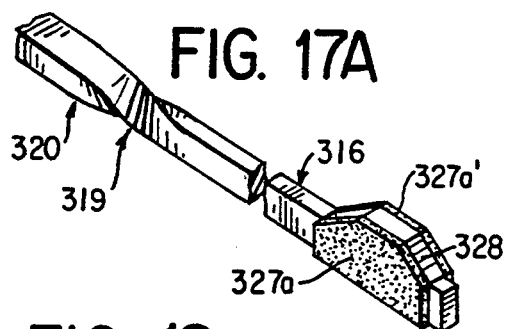
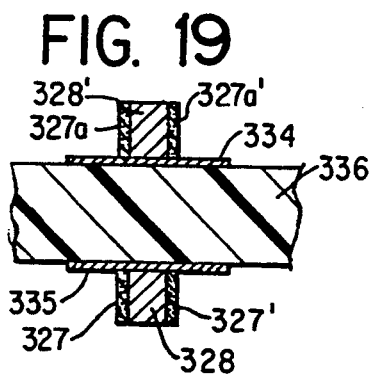
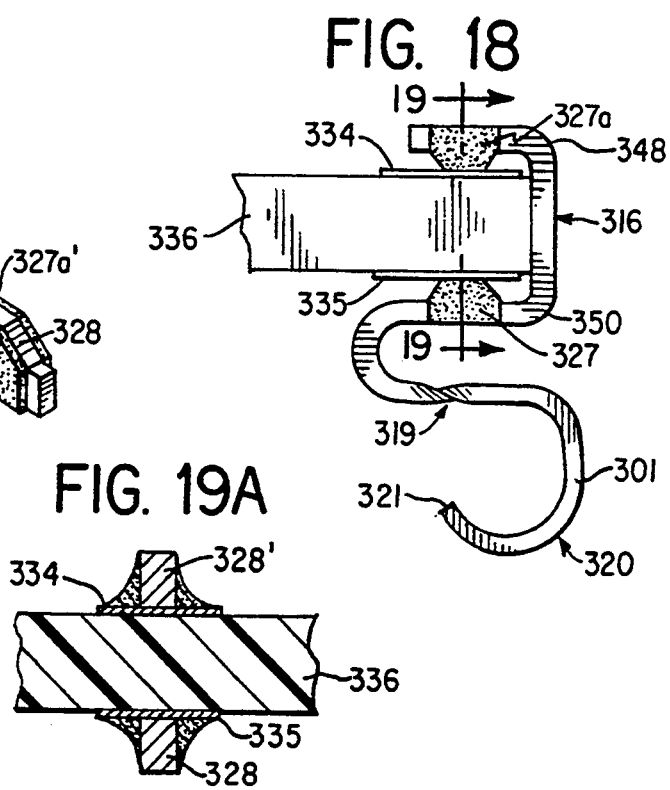

SOLDER-BEARING LEAD the present application is the national Phase of PCT application No. PCT/US91/02489 filed Apr. 11, 1991, which is a continuation-in-part of application Ser. No. 07/510,004 filed Apr. 13, 1990, now U.S. Pat. No. 5,030,144 issued Jul. 9, 1991.

BACKGROUND OF THE INVENTION

1. Field of the Invention

This invention relates to solder-bearing contacts and leads for attachment to contact pads on substrates such as electronic circuit boards, chip carriers, or the like.

2. Description of the Related Art

In the electronic equipment industry, it is known to provide leads for connection to contact pads of printed circuit boards and other substrates by soldering the leads thereto. See, e.g. U.S. Pat. Nos. 4,728,305 and 4,597,628. However, as the electronic industry continues to move toward greater miniaturization, the size and spacing between the contact pads has accordingly been reduced. This requires a corresponding reduction in the size and spacing of the leads which are to be connected to contact pads.

However, in attempting to reduce the spacing between leads, it is also important to provide sufficient spacing to prevent inadvertent contact or arcing between adjacent leads.

The objective of size/space reduction of the leads must be achieved without sacrificing accuracy in manufacture of the leads. It is also desirable to provide rapid assembly of multiple leads. Prior construction and manufacturing processes of leads have been unable to achieve effectively the required reduced size and spacing.

Thus, the need exists for effectively applicable leads of reduced size and spacing to accommodate the current reduction in the size and spacing of contact pads of substrates, but sufficiently spaced to prevent arcing. The need also exists for a method of manufacturing such leads without sacrificing accuracy.

SUMMARY OF THE INVENTION

The present invention overcomes the problems and deficiencies of the prior art by providing solder-bearing leads of reduced size and spacing to accommodate current reductions in the size and spacing of contact pads of printed circuit boards, circuit chips, or other substrates. The leads may be formed from a continous metal strip by progressive stamping. The solder-bearing portion of the lead of the present invention in one form includes a pair of projections extending from one edge to form a gap therebetween which is dimensioned to receive and retain a solder mass. A region of a portion of the lead is twisted so that the edge of the solder-bearing portion containing the projections is bent so that the projections lie in a plane substantially perpendicular to the plane of the remaining portion. Since the thickness of the lead when initially formed is less than its width, the twisting of the solder-bearing portion results in a lesser width of that portion adapted to contact the substrate and permits closer spacing of leads. A solder mass is placed and held within the gap between projections of the solder-bearing portion to provide electrical bonding between the lead and the substrate.

In a modified form, the projections referred to may be dispensed with or modified to eliminate any gap. Instead, the solder is applied as one or more stripes on the continuous strip from which the leads are formed, before stamping and twisting. The solder-bearing portion of the lead after twisting is adapted to be applied to the contact pad with the edge of the lead and its adjoining solder stripe or stripes applied against the contact pad.

The solder-bearing lead can be used inter alia as an edge clip for securing to a substrate or for surface mounting on the substrate. The solder-bearing lead can advantageously be made by automatic progressive stamping of blanks at high speed and simple twisting of the lead. The leads may be readily configured to be attached to a carrier strip and for group attachment to a substrate, with provision thereafter to remove the solder-bearing and terminal portions of the lead from the carrier.

BRIEF DESCRIPTION OF THE DRAWINGS

The objects, features, and advantages of the present invention will be more completely disclosed with reference to the following detailed description of presently preferred embodiments of the present invention, taken with the attached drawings, in which:

FIG. 1A shows a plan view of a continuous strip formed into flat blanks for use in making one embodiment of the lead of the present invention;

FIG. 1B shows an isometric view of an end portion of the lead of FIG. 1A;

FIG. 2A shows a plan view of the leads of FIG. 1 having a twist in accordance with the present invention;

FIG. 2B shows an isometric view of an end portion of the twisted lead of FIG. 2A;

FIG. 3 shows a plan view of leads of FIG. 2A each retaining a solder mass;

FIG. 4 shows a side sectional view of a lead as in FIG. 2 shown retaining a solder mass and bent into a configuration for surface mounting to a substrate;

FIG. 5 shows a plan view of a modified form of the stamped blank for use in making another embodiment of the lead of the present invention;

FIG. 6 shows a plan view of the leads of FIG. 5 each having a twist in accordance with the present invention:

FIG. 7 shows a plan view of the leads of FIG. 6 each retaining two solder masses;

FIG. 8 shows a side view of a lead as in FIG. 7 bent into a configuration to form a clip for a substrate;

FIG. 9 shows a side view of a lead as in FIG. 7 bent into an alternate configuration to form a clip for a substrate;

FIG. 10 shows a plan view of another modified form of stamped blank for use in making yet another embodiment the lead of the present invention;

FIG. 11 shows a plan view of a portion of the leads of FIG. 10 each having a twist in accordance with the present invention and retaining solder masses;

FIG. 12 shows a side view of a lead as in FIG. 11 bent into a configuration to form a clip for a substrate and for surface mounting to another substrate;

FIG. 17A is a fragmentary perspective view of the end of one lead blank of FIG. 17;

FIG. 18 is a view similar to FIG. 8 showing the relationship of the lead of FIGS. 14 to 17 to a substrate and its contact pads;

FIG. 19 is a fragmentary cross-sectional view FIG. 18 taken along line 19—19 thereof, showing the lead and its solder stripes assembled to the substrate;

FIG. 19A shows the arrangement of FIG. 19 after heating and resolidification of the solder.

DETAILED DESCRIPTION OF THE PREFERRED EMBODIMENTS

Figure 13:
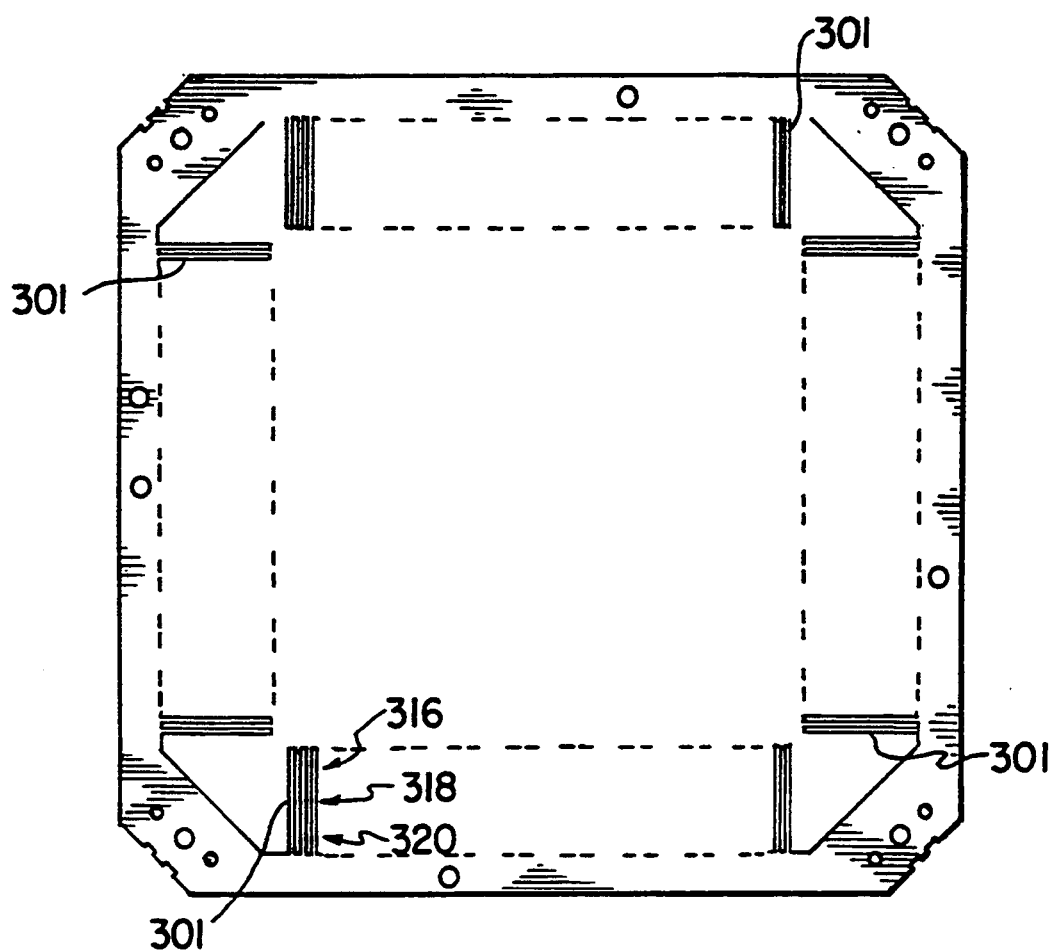
FIG. 13 shows a top plan view of a rectangular-shaped frame of leads according to the present invention for surface mounting to a chip or chip carrier.

Referring now to the drawings, wherein like reference numerals represent identical or corresponding parts throughout the several views, FIG. 1A illustrates a stamped strip having a sequence of side-by-side individual blanks 10 for the leads of the invention, formed by stamping from a conductive strip, such as of beryllium copper or like resilient conductive material. The individual blanks 10 extend from a carrier strip 12. Strip 12 is shown with sprocket holes 14 for indexing the blanks 10 step-by-step through subsequent progressive stamping steps for forming the blanks into final form.

The blanks 10 are adapted to be removed, in region 11, preferably by scoring along score lines 17, from carrier strip 12 after joining to a substrate. They are shaped to form the leads of the present invention and to receive a solder mass or slug for mounting to substrates such as printed circuit boards, chips, chip carriers or the like. The broken lines at the carrier strip 12 of FIG. 1A indicate that although only two blanks for forming leads are shown, any number of blanks can be provided side by side along carrier strip 12.

The entire blank 10, when formed (stamped) as shown in FIG. 1A, lies in the same plane as carrier strip 12. The width w of the leads 10 is greater than their thickness t (FIG. 1B), which, as will become apparent from the discussion below, advantageously provides a reduced width portion when the leads are twisted out of the plane of the remaining portion of the blank.

As shown in FIGS. 1A and 2A, the leads are preferably attached to the carrier strip 12 so a portion 21 extends into the space 13 between the parallel strips 25 of material, thereby reducing the length of the lead which would otherwise extend from the carrier strip 12. The lead can extend through the entire space 13 up to edge 23 of strip 12, if desired. Securement at a central region of the lead also advantageously provides sufficient rigidity during manufacturing and shaping.

The blank leads 10 are identical and each is formed of an elongated body portion 15 of sufficient length for the intended use of the lead. Body portion 15 has parallel left and right side edges 24, 26, respectively and includes a solder-bearing portion 16, a middle portion 18, and an end portion 20 attached to carrier strip 12. The designation of right and left side edges is for convenience of description only, since if the orientation of the lead is changed, the side edge references will change as well.

Lead 10 further includes a pair of extensions 28 protruding from the right side edge 26 of solder-bearing portion 16. (For clarity, all the labels do not appear on each lead.) Of course, the extensions 28 can alternatively protrude from the left side edge 24. Each protrusion 28 is preferably right-triangular shaped and is spaced apart from the matching protrusion 28 to form a gap 30 therebetween. The gap 30 is dimensioned to have a width y substantially equal to the width of a solder wire to be placed therein, as described below. Obviously, the protrusions can be other shapes beside triangular so long as they achieve the function of creating a sufficient gap for receiving the solder mass and are shaped to be able to retain the solder mass therein.

FIGS. 2A, 2B show leads 10 twisted about their longitudinal axis L at middle portion 18, and specifically at region 19, through an approximate 90 degree angle, so that the projections 28, as well as the entire solder-bearing portion 16, lie in a plane substantially perpendicular to the plane of end portion 20. The lead 10 is twisted so that the right side edge 26 is bent upward as seen in FIGS. 2A and 2B. After twisting, the solder-bearing portion 16 remains substantially aligned with the longitudinal axis L of body portion 15. By twisting the solder-bearing portion 16 which, like the remaining body portion 15, has a thickness t less than its width w, the width of the solder-bearing portion is in effect reduced since the new width, measured as the distance between the side edges, now corresponds to the thickness t (see FIG. 2B). This provides a greater spacing between leads without reducing the pitch (or number of leads per inch) along the carrier strip.

As shown in FIG. 3, a solder mass 27 is placed within gap 30. One way of introducing the solder mass 27 in the gap is to place an integral solder wire (not shown) between the horizontally aligned gaps 30 of a row of leads 10 and then to cut the wire between adjacent gaps to leave a shorter, but sufficiently sized, section of solder wire therebetween. This is described in U.S. Pat. Nos. 4,597,628, and 4,728,305, both of which are herein incorporated by reference. The solder mass 27 may be flush with the outer gap of channel 30 or may extend above the channel, as disclosed in U.S. Pat. No. 4,728,305. Furthermore the tips 29 of the projections 28 may be bent inwardly into or to partially encircle the solder mass 27 to improve retention.

In FIG. 4, the solder-bearing portion 16 of the lead 10 is bent at region 33 at an approximate right angle to the end portion 20. The solder mass 27, retained within gap 30 of solder bearing portion 16, may be placed in contact with a conductive pad 34 on a surface of a substrate 36, such as a printed circuit board, and then heated to melt the solder, to provide electrical contact between lead 10 and pad 34 on cooling. The terminal end 35 of the end portion 20 of the lead 10 may be suitably formed in any desired one of a number of ways for connection to other equipment, such as being formed as a pin for insertion into a contact receptacle, or as a wirewrap post termination.

FIG. 5 shows a modified form of a stamped strip 12 carrying a sequence of blanks for forming leads 101. In this embodiment, each lead blank 101 is provided with two sets of projection pairs 128, 128' extending from the right side edge 126 of the body portion 115. Extensions 128' are identical to extensions 128 and each pair are spaced apart to form a gap 130, 130' therebetween, similar to gap 30, to receive solder mass 27.

The end portion 120 includes an extended portion 121 extending beyond the score lines 17 for formation of fingers discussed below.

As shown in FIGS. 6 and 7, each lead 101 includes a twisted portion 119 in its middle portion 118, so that extensions 128, 128', as well as the entire solder-bearing portion 116, lie in a plane substantially perpendicular to the plane of the end portion 120. Solder mass 27 is retained within gaps 130, 130', as in FIG. 3, and lead 101 can be used for electrical connection with planar conductive areas on a substrate. As shown in FIG. 8, lead 101 is arranged as a clip for mounting a substrate. The solder-bearing portion 116 of lead 101 is bent at 48, 50 and 52, (forward of twist 119), into a substantially reverse S-shaped configuration to form a channel 54 between the solder retaining projections 128, 128'. Substrate 36, having conductive pads 34 on its opposing surfaces, may be retained within channel 54 for soldering to lead 101. Alternately, a conductive pad may be omitted or an insulating pad can be provided instead of one of the conductive pads 34 if connection to only one of the surfaces of the substrate is desired. Extended portion 121 of end portion 120 is bent to form a finger extending in the direction away from the channel 54 and is suitably formed to be connected to other equipment.

In an alternate arrangement of lead 101, illustrated in FIG. 9, the finger which is formed from extension 121 of end portion 120, is hook-shaped and extends in the same direction as channel 54. Like the finger of FIG. 8, it is adapted to be connected to other equipment. In the embodiment of FIG. 9, substrate 34 is shown having only one conductive pad 34 which abuts solder mass 27 placed in gap 130' between projections 128'. A non-conductor 56 may replace one of the solder masses where it is desired to insulate the lead from one surface (e.g. the lower surface) of the substrate. This type of mounting is used when it is desired to make electrical contact with only one surface of the substrate. Of course, if desired, two conductive pads can be provided as in the arrangement of FIG. 8.

FIG. 10 shows a fragmentary portion of a modified stamped blank carrying a sequence of blanks for forming leads. In this embodiment, each lead blank 201 is provided with three pairs of projections 228, 228', 228", extending from the right side edge 226 of blank 201. The projections 228, 228', 228" of each pair are spaced apart from one another, so that each pair forms a gap 230, 230', 230", respectively, therebetween to receive a solder mass 27. FIG. 11 shows the lead 201 twisted in region 219 of its middle portion 218 so that all of the projections 228, 228', 228" (and the entire solder-bearing portion 216) lie in a plane substantially perpendicular to the plane of the end portion 220 of the lead 201. Solder mass 27 is shown retained in each gap.

FIG. 12 illustrates one arrangement of the triple-projection lead 201 of FIG. 11, showing an example of its many uses. The solder bearing portion 216 of lead 201 is bent at regions 248, 250 and 252 into a substantially reverse S-shaped configuration. Gaps 230, 230' face one another to form a channel 254 which may receive a substrate 36 therebetween and gap 230" is adapted for receiving a solder mass for surface mounting a substrate. Extended portion 221 of end portion 220 may form an additional terminal, or be removed if desired.

FIG. 13 illustrates a rectangular array of leads 301, (the dotted lines indicating a continuous row of solder bearing leads not separately depicted), each having the twist of the present invention, for surface mounting to a chip carrier or other substrate having conductive pads or elements in a cooperating rectangular array. This arrangement thus allows easy simultaneous mounting of multiple leads to such a substrate. Each of the leads 301 has a construction as in FIG. 2B, with a pair of projections extending from solder bearing portion 316 and twisted in middle portion 318 so that projections lie in a plane perpendicular to the plane of end portion 320. A solder mass is inserted into each gap formed between each pair of the projections and is heated and cooled to provide good electrical contact between the leads and conductive pads or elements of the substrate.

As can be seen in all the foregoing embodiments of the lead, a reduction in pitch and spacing of the leads can be achieved in manufacture. That is, since the projections extend from only one side edge of the lead, closer side-by-side arrangement (see distance D in FIG. 1A) of the leads can be obtained in manufacture of the blanks.

Additionally, the blanks are formed so that the thickness of each lead is less than its width. Consequently when the solder-bearing portion is twisted out the plane of the remaining portion of the lead so that it lies substantially perpendicular to the plane of the end portion, a reduction in new width dimension of the solder-bearing portion is advantageously achieved. For example, in one embodiment, the width of the original blank measured from its right side edge to its left side edge may be 0.007 inch and the thickness of the blank, measured from its upper surface to its lower surface, may be 0.005 inch. Thus, when the solder-bearing portion is twisted to its perpendicular position, the new width of the solder-bearing portion, measured as the distance between its new right and left side edges, is 0.005 inch. This provides a desirable increased distance between leads without reducing their pitch. In another embodiment, the width may be 0.008 inch and the thickness may be 0.006 inch. Obviously, these dimensions are provided only by way of example, as leads with other dimensions are clearly contemplated by the present invention.

In forming the lead, the blank is stamped so that each blank has a pair of substantially parallel right and left side edges and at least one pair of projections extending from one of its side edges. A middle portion of the lead is then twisted so that the projections lie in a plane substantially perpendicular to the plane of the opposing end portion of the lead. The solder mass is placed within the gap between the pair of projections to provide electrical contact with the substrate. The lead is subsequently separated from its carrier strip.

While the above embodiments show a pair of projections (28 or 128 or 228 etc.) for retaining the solder mass, a single projection may be used which is longer than the height of the solder mass, and bent over a portion of the solder mass to hold it in place. This single projection construction can be used in any of the lead arrangements described above.

Figure 14:
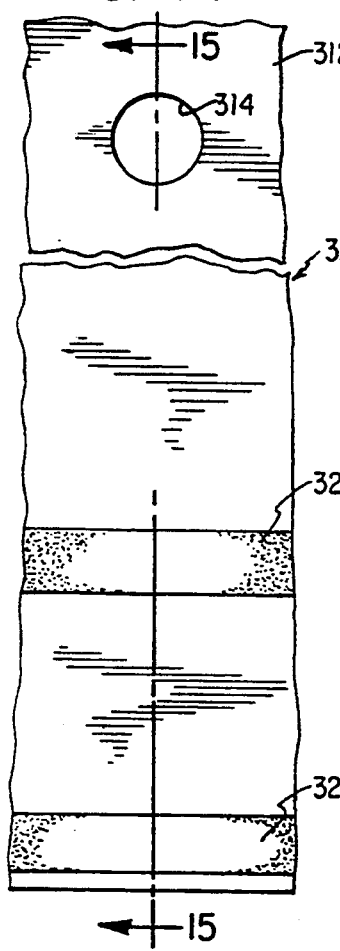
FIG. 14 shows a plan view of a section of a continuous conductive strip bearing solder stripes.
Figure 15:
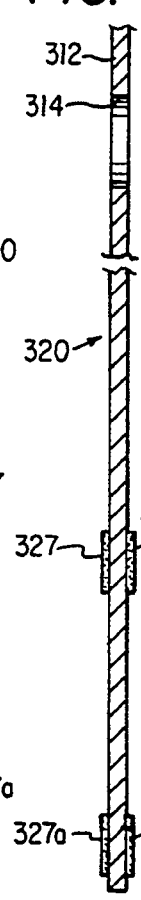
FIG. 15 shows a cross-sectional view of the strip of FIG. 14 along line 15—15 thereof.

FIGS. 14 to 19 show another solder-bearing arrangement for leads according to the invention. The reference numerals in FIGS. 14 to 19 correspond to those in the preceding figures for the same or corresponding elements, with the substitution of numeral "3" for the first digit in the previous reference numerals. FIG. 14 shows a portion of a continuous conductive strip 312 having timing or sprocket holes 314 and bearing certain solder stripes 327, 327A. Such stripes may be applied to a conductive strip 312 (such as beryllium copper) in conventional way, such as by applying molten solder to a cleaned area of the strip (or to an area covered by solder flux material) as the strip passes an outlet for the molten solder, and allowing the solder to solidify. Another way is to apply the solder stripe as a ribbon mechanically impressed (e.g. cold-welded) to the strip 312. Alternatively, where the thickness of strip 312 permits, it may be skived to form a shallow channel in which a solder ribbon may be inlaid. The number of solder stripes may be selected in accordance with the intended use of the leads. For joining to a single contact pad (similar to FIG. 4) a single stripe 327 would be provided. For joining to both sides of a substrate (similar to FIG. 8) two stripes would be provided. For an arrangement similar to FIG. 12, three would be provided. In addition, each stripe 327, 327a, etc. is desirably provided on both faces of conductive strip 312, as seen in FIG. 15, although in some instances the stripes 327, 327a etc. may be placed on only one face of the continuous strip 312.

Figure 16:
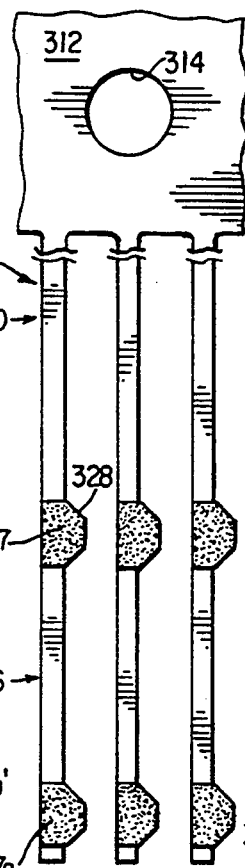
FIG. 16 is a plan view of the strip of FIG. 14, partially stamped out to form a set of lead blanks, and generally corresponding to FIG. 5.

FIG. 16 shows the strip 312 after stamping but before final forming of the lead. FIG. 16 omits the channels or gaps 30 from projections 328, which are preferably provided with flat faces 329 as shown, for good contact to the substrate conductive pads 334, as seen in FIG. 18. However, the projections 328 may be rounded or even eliminated, where desirable.

Instead of holding the solder in a gap 30 as in the previous forms of the invention, after stamping the solder stripes 327 remain on the lead body 310, covering all or most of the face of projections 328. As indicated above, the solder stripes 327 may be provided on one or both faces of each lead 310.

Figure 17:
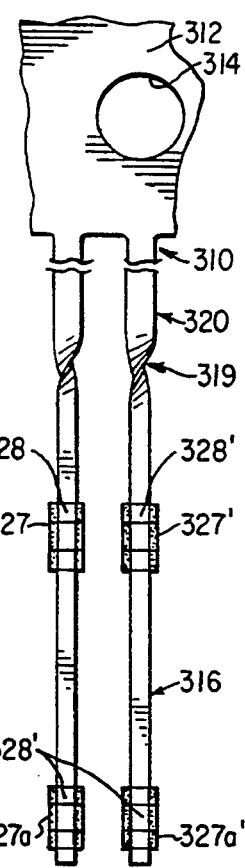
FIG. 17 is a plan view of the blank of FIG. 16, after twisting the lower ends of the lead blanks corresponding to FIG. 6.

The form of the invention shown in FIGS. 13 to 19 has the beneficial feature that the solder 327 which was on the faces of the strip 312, is caused to be on the sides of the lead as seen in FIG. 17A. As indicated in FIGS. 17 and 17A, the body 310 of each lead is twisted at 319 so that the portion 316 extends at right angles to the portion 320. In this way, the solder stripes 327 appear on one or both sides of the lead portion 316. FIG. 18 shows how a clip-type lead formed from the blank of FIG. 16, may be applied to a substrate 336 having contact pads 334, 335. The solder-bearing portion 316 of the lead 1 is bent at 348, and 350, forward of twist 319, into a substantially reverse-S-shaped configuration to form a channel 354 between the projections 329, 329'. A substrate 336 having conductive pads 334, 335 on its opposing surfaces may then be retained within channel 354 for soldering to the lead. Alteratively, one conductive pad may be omitted and an insulating pad may be provided in its place if connection to only one of the surfaces of the substrate is desired. Extended portion 321 of the lead end portion 320 is bent to form a finger extending in a direction away from or toward the channel 354, and is suitably formed to be connected to other equipment. FIGS. 19 and 19A show a cross-sectional view of the same arrangement, before and after reflow of the solder.

As seen in FIG. 18, when the lead is juxtaposed to a conductive pad 334 or 335 of a substrate 336, the projection 328 or 328' is in direct contact with a respective conductive pad. The solder 327, 327a along the sides of the lead as seen in FIG. 19 also has an edge portion in contact with the contact (?) pad, so that upon liquefying the solder by heat, the solder can readily flow along the sides of the lead, to the adjacent portion of the conductive pad 334 to solder the projection 328 to the pad 334 as seen in FIG. 19A. Where desirable, the projection 328 may be rounded, or reduced in size, placing the lead body closer to or directly on the conductive pads with a desired contact area for a better electrical connection.

The projections 328 may, if desired, even be omitted (but leaving the solder on the side or sides of the leads) to provide the further advantage that the space required for the projections is eliminated, so that the leads may be more closely spaced along strip 312, as is desirable for further miniaturization. In such case, the portion 316 and the bends 348 and 350 shown in FIG. 18 are dimensioned so that the lead portions at the location of the solder mass carried thereby, will lie close against the respective contact pads 334 and 335.

Where desirable or needed, the portion of the lead adjacent to or between the solder stripes 327 appearing in FIG. 14 may be allowed to become oxidized or may be deliberately oxidized, which would have the effect of not being wettable by and resisting or repelling molten solder. This would essentially confine the molten solder to the edge of the lead adjoining the contact pad and in the region of where the solder exists, as would be desirable. In such case the edge of the lead which has been stamped from the starting strip would not be oxidized, because of the shearing action of the stamping process, and would be in good condition for soldering, in contrast with the adjacent areas which would be oxidized to repel solder.

It will be understood that the arrangement for providing solder on a lead as shown in FIGS. 14 to 19 may be used with any of the lead shapes or arrangements of FIGS. 1 to 13, having either single or multiple soldering points, and having the solder on either one side or both sides of the twisted lead in substitution for the arrangements 28, 29, 30 or 123, 129, 130 or 228, 229, 230.

It will be apparent that the form of the invention embodied in FIGS. 14–19 has some advantages over that of FIGS. 1–3. The former avoids the need for the steps of applying the solder ribbon into the gaps 30, 130, etc., then closing the projections 28, 128, etc. around the solder, and thereafter cutting the solder ribbon to isolate the individual solder masses. Contrariwise, the solder masses are separated simultaneously with stamping out the lead bodies. This affords greater simplicity in fabrication. Also, FIGS. 14–19 offer the possibility of even closer lead spacing along the master strip, by permitting reducing or eliminating the projections 28, 128, etc.

The arrangements of the leads of the present invention described above will be understood to be by way of example only, since numerous other arrangements are possible, depending on the desired mounting of the substrates. Moreover, in addition, a number of projections other than the number shown in the above examples could be provided.

It will be understood that the solder-retaining arrangement of the present invention is suitable for many other applications, where it will have the advantages discussed above as well as others. Accordingly, the above embodiments are to be deemed illustrative only, and, within the scope of the appended claims, the present invention may be practiced otherwise than as specifically described herein.

What is claimed is:

1. A lead for soldering to a conductive surface comprising:
   a elongated body including a first portion adapted to retain solder, a substantially flat terminal portion, and a middle portion disposed between said first portion and said terminal portion,
   said first portion including at least one solder mass affixed thereto, a region of said body being twisted about a longitudinal axis at said middle portion so that said first portion lies in a plane substantially perpendicular to the plane of said terminal portion.

2. A lead as in claim 1 wherein said first portion includes
a pair of coplanar projections extending from a first edge of said body and forming a gap there between dimensioned to receive a solder mass, and
said solder mass being in said gap.

3. A lead as in claim 1 wherein said solder mass is secured to at least one side of said first portion.

4. A lead as in claim 1 wherein said first portion includes at least one coplanar projection extending from a first edge, and said solder mass is positioned on a face of said projection and on an adjoining area of said first portion.

5. A lead as in claim 1 wherein said solder mass is formed as a solder layer on a face of the first lead body portion.

6. A lead as in claim 5 having a solder mass on each of two opposed faces of said first lead body portion.

7. A lead as in claim 1 wherein said first lead body portion includes at least one coplanar projection from an edge of said body portion, and said solder mass is formed as a layer on both faces of said projection and said first body portion.

8. A method of forming a series of leads for soldering to contact pads of a substrate, comprising the steps of
providing a continous conductive strip having a solder stripe thereon,
forming from said strip by stamping a succession of flat elongated lead blanks, each lead blank having first and second portions along its length, one of said portions having said solder stripe thereon,
and twisting one of said portions of each said lead blank relative to the other so that said one portion lies in a plane substantially perpendicular to the plane of the other portion of said lead blank.

9. A method of forming a series of leads for soldering to contact pads on a substrate comprising the steps of
providing a continuous conductive strip,
stamping said strip progressively to form a succession of flat elongated lead blanks, each lead blank having first and second portions,
twisting one of said portions of each said lead blank relative to the other so that said one portion is in a plane substantially perpendicular to the plane of the other portion of said lead blank,
and applying solder to said first portion.

10. A method as in claim 9 wherein said solder is affixed to said first portion before said twisting.

11. A method as in claim 9 wherein said solder is affixed to said first portion after said twisting.

12. A method as in claim 10 wherein said solder is affixed to said strip before forming said lead blanks.

13. A method as in claim 9 also including forming on each lead blank at least one projection extending laterally from a first edge of said one portion and applying said solder adjacent said projection.

14. A method as in claim 13 including forming a pair of projections extending laterally from an edge of said first portion to form a gap between said projections, and affixing solder to said lead in said gap.

15. A method as in claim 9 wherein said solder-applying step includes the step of applying a solder stripe along said conductive strip before said stamping step.

16. A lead formed from a blank which comprises an elongated body having first and second edges and also having a solderable portion and a substantially flat terminal portion, the transverse dimension of said solderable portion parallel to the plane of said flat portion being less than the width of said flat portion, said solderable portion lying substantially along a longitudinal axis of said body, said solderable portion and said terminal portion being substantially in alignment and in planes substantially perpendicular to one another.

17. A lead as recited in claim 16, wherein the width of said terminal portion is substantially 0.005 to 0.006 inch and the width of said solderable portion is substantially 0.007 to 0.008 inch, said solderable portion being in a plane substantially perpendicular to said flat terminal portion with the thickness of said solderable portion being substantially in the direction of the terminal portion width.

18. A lead comprising an elongated body having first and second edges and also having a solderable portion carrying a solder mass and having a substantially flat terminal portion, the width of said solderable portion being less than the width of said flat portion, said solderable portion lying substantially along a longitudinal axis of said body portion, said body further comprising at least one projection extending from an edge of said solderable portion and adapted to hold a solder mass.

19. A lead as recited in claim 18, comprising a pair of projections extending from an edge of said solderable portion and having said gap therebetween.

20. A method of forming a solderable lead arrangement comprising the steps of:
providing an elongated flat strip of conductive material having thereon a band of solder extending along its length,
forming therefrom a series of parallel transverse leads each joined at one end to a carrier strip,
each of said leads having an elongated body and a lateral projection on one edge of said lead body at the location of said solder band, and
causing each of said projections to be at an angle to portion of its respective body,
whereby said projections may be placed with an edge in direct metal-to-metal contact with substrate conductive areas and soldered thereto without shifting due to melting of solder.

21. A method as in claim 20 including providing said solder on both sides of each said projection.

22. A method as in claim 20 further including:
forming at least certain of said leads in the form of a U-shaped clip, with said projections formed on facing arms of said clip and extending toward one another, said projections being spaced by a gap correlated to the thickness of a substrate to be inserted in and resiliently retained by said clip.

23. The method of soldering a lead to a surface conductive area of a substrate, comprising:
forming a conductive lead having a flat body portion and a flat projection at one edge of said body portion, said body portion having a layer of solder on one face of said projection, and no solder on another face of said projection,
placing said body portion with said non-solder bearing face of said projection in metal-to-metal contact with and with said projection substantially perpendicular to said conductive area, and
applying heat to solder said body to said area.

24. A solderable lead for connection to a device having a conductive area, comprising:
 an elongated body of electrically conductive sheet material, said body having a contacting non-solder-bearing portion with a surface for contacting said conductive area of said device with a metal-to-metal contact;
 said body having another portion for contacting said conductive area with a surface contiguous to said contacting portion;
 a layer of solder on said latter contiguous surface and extending immediately adjacent to said contacting portion such that, upon heating, said layer of solder will liquefy and migrate to form a soldered joint between said contacting portion and said conductive area when they are juxtaposed.

25. A solderable lead according to claim 24, wherein said solder layer covers a surface of said body angularly disposed to said non-solder-bearing contacting portion.

26. An assemblage of leads, each as in claim 24, each lead being integral with a carrier strip and said leads being spaced along said carrier strip.

27. A solderable lead for connection to a device having a conductive area, comprising:
 an elongated body of electrically conductive sheet material, said body having a contacting portion with a surface for contacting said conductive area of said device with a metal-to-metal contact;
 said body having another portion with a surface contiguous to said contacting portion;
 a layer of solder on said latter contiguous surface and extending immediately adjacent to said contacting portion such that upon heating, said layer of solder will liquefy and migrate to form a soldered joint between said contacting portion and said conductive area,
 said contiguous portion being formed by a projection which is at an angle to a portion of said body and said contacting portion being constituted by an edge of said projection.

28. A lead as in claim 27 wherein said solder also overlies said body adjacent said projection.

29. The method of producing a lead soldered to a conductive pad of a substrate comprising the steps of:
 providing a lead having an elongated body of electrically conductive sheet material, said body having a contacting portion with a non-solder-bearing surface for contacting said conductive area of said device with a metal-to-metal contact;
 said body having another portion for not contacting said conductive area, with a surface contigous to said contacting portion, and also having a layer of solder on said latter contiguous surface and extending immediately adjacent to said contacting portion;
 placing said lead contacting portion in direct metal-to-metal contact with said substrate conductive area with no solder therebetween;
 heating said lead to melt said solder layer and to cause said solder to flow into the region adjacent the juncture of said contacting portion and said conductive area;
 whereby on cooling, said conductive pad is soldered to said contacting portion.

30. A surface-mounting lead for soldering to a conductive pad on the surface of a substrate comprising:
 an elongated flat body including a first portion having at least one solder element thereon, and a flat terminal portion,
 said first body portion lying in a plane substantially perpendicular to the plane of said terminal portion, so that an edge of said first body portion is substantially co-planar with said terminal portion.

31. A lead as in claim 30 wherein said first body portion includes
 a pair of co-planar projections extending from a first edge of said body,
 said solder element being on each said projection.

32. A lead as in claim 30 wherein at least one face of said first body portion has a solder layer thereon.

33. A lead as in claim 30 wherein said first body portion includes at least one projection extending from a first edge of said body, and said solder element is positioned on a face of said projection and also on an adjoining area of said first body portion.

34. A lead as in claim 30 wherein said solder element is formed as a solder layer on a face of the first lead body portion.

35. A lead as in claim 30 having a solder element on each of two opposed faces of said first body portion.

36. A lead as in claim 30 wherein said first body portion includes at least one projection from an edge of said body portion, and said solder element is a layer on both faces of said projection and on said first body portion.

37. A lead adapted to be soldered to a conductive surface area, comprising:
 an elongated body having first and second side edges, and including a first body portion adapted to retain solder, a terminal portion, and a middle portion disposed between said first body portion and said terminal portion,
 said first body portion including a pair of co-planar projections extending from said first edge of said body and forming a gap therebetween dimensioned to receive solder;
 a region of said body being oriented to cause said projections to lie in a plane substantially perpendicular to the plane of said terminal portion.

38. A lead as recited in claim 37, wherein said first body portion is at substantially a right angle to said terminal portion for applying to a substrate.

39. A lead as recited in claim 37, further comprising a second pair of projections extending from said first edge of said first body portion, said second pair of projections forming a second gap therebetween.

40. A lead as recited in claim 39, wherein said first body portion is bent so that said gaps of each of said pairs of projections face one another to form a channel therebetween to engage a substrate.

41. A method of forming a series of leads for soldering to a corresponding series of contact pads on a substrate comprising the steps of
 providing a continuous strip conductive material,
 stamping said strip progressively to form a succession of flat elongated lead blanks, each lead blank having first and second portions,
 changing the orientation of one of said portions of each said lead blank relative to another portion so that said one portion is in a plane substantially perpendicular to the plane of the other portion of said lead blank,
 and applying solder to said one portion.

42. A method as in claim 41, wherein said solder-applying step includes the step of applying a solder strip along said conductive strip before said stamping step.

43. A method as in claim 41 wherein the orientation of said one portion is changed by twisting and said solder is affixed to said first portion before said twisting.

44. A method as in claim 41 wherein said solder is affixed to said strip before forming said lead blanks.

45. A method as in claim 41 also including forming on each lead blank at least one projection extending laterally from a first edge of said one blank portion and applying said solder on said projection.

46. A method as in claim 41, wherein said orientation changing is performed by twisting said one blank portion substantially 90° relative to said other blank portion.

47. A blank for leads for connection to electrical apparatus, comprising an elongated strip of electrically conductive material, one longitudinally extending portion of said strip constituting a carrier portion, said strip also including a series of parallel supporting strips integral with and extending laterally from said carrier portion, and a lead body parallel to and between each pair of consecutive supporting strips, each lead body being supported from the ends of its adjacent supporting strips by severable joins so that one portion of said lead body is between said supporting strips and another portion is not.

48. A blank as in claim 47, wherein said other portion of each said lead body is twisted about its longitudinal axis with respect to said one lead body portion into a plane substantially perpendicular to that of said one portion of said lead body.

49. A blank as in claim 48, wherein said twisted body portion has a configuration thereon adapted to retain a solder.

* * * * *